(12) United States Patent
Hayes et al.

(10) Patent No.: US 7,595,351 B2
(45) Date of Patent: Sep. 29, 2009

(54) ACTINIC RADIATION CURABLE COMPOSITIONS AND THEIR USE

(75) Inventors: Barrie James Hayes, Eversden (GB); Laurence Josette Messe, Great Chesterford (GB)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 462 days.

(21) Appl. No.: 10/516,978

(22) PCT Filed: Jun. 4, 2003
(Under 37 CFR 1.47)

(86) PCT No.: PCT/GB03/02410

§ 371 (c)(1),
(2), (4) Date: Aug. 22, 2005

(87) PCT Pub. No.: WO03/104296

PCT Pub. Date: Dec. 18, 2003

(65) Prior Publication Data

US 2006/0235101 A1    Oct. 19, 2006

(30) Foreign Application Priority Data

Jun. 6, 2002   (GB) ................. 0212977.3

(51) Int. Cl.
| | |
|---|---|
| C09D 163/00 | (2006.01) |
| C09D 167/00 | (2006.01) |
| C09D 171/00 | (2006.01) |
| G03C 1/725 | (2006.01) |
| C08L 63/00 | (2006.01) |

(52) U.S. Cl. ................ 522/18; 522/15; 522/170; 522/146; 522/25; 522/28

(58) Field of Classification Search .......... 522/25, 522/28, 170, 15, 18, 146
See application file for complete search history.

(56) References Cited

U.S. PATENT DOCUMENTS

| | | | |
|---|---|---|---|
| 3,395,121 A | 7/1968 | Pfann | |
| 3,708,296 A | 1/1973 | Schlesinger | |
| 4,341,819 A | 7/1982 | Schreffler | |
| 4,632,891 A | 12/1986 | Banks | |
| 4,906,711 A | 3/1990 | Markovitz | |
| 5,124,234 A | 6/1992 | Wakata et al. | |
| 5,359,017 A | 10/1994 | Hamazu et al. | |
| 5,453,450 A * | 9/1995 | Kinzer et al. ............... 522/18 |
| 5,476,748 A | 12/1995 | Rice et al. | |
| 5,494,943 A * | 2/1996 | Mahoney et al. .......... 522/66 |
| 5,506,087 A | 4/1996 | Lapin et al. | |
| 5,604,275 A * | 2/1997 | Zhong et al. .............. 524/96 |
| 5,629,133 A | 5/1997 | Wolf et al. | |
| 5,665,792 A | 9/1997 | Lawton et al. | |
| 5,688,878 A | 11/1997 | Decker et al. | |
| 5,694,852 A | 12/1997 | Bressler et al. | |
| 5,780,560 A | 7/1998 | Decker et al. | |
| 5,932,288 A | 8/1999 | Decker et al. | |
| 5,972,563 A | 10/1999 | Steinmann et al. | |
| 6,106,999 A | 8/2000 | Ogiso et al. | |
| 6,191,681 B1 | 2/2001 | Cole et al. | |
| 6,242,513 B1 | 6/2001 | Zhou et al. | |
| 6,316,049 B1 | 11/2001 | Decker et al. | |
| 6,379,866 B2 | 4/2002 | Lawton et al. | |

FOREIGN PATENT DOCUMENTS

| | | |
|---|---|---|
| EP | A 35969 | 9/1981 |
| EP | A 44272 | 1/1982 |
| EP | A 54509 | 6/1982 |
| EP | A 153904 | 9/1985 |
| EP | A 164314 | 12/1985 |
| EP | A 646580 | 4/1995 |
| JP | A 560053129 | 5/1981 |
| JP | 2086616 | 3/1990 |
| JP | A 030255185 | 11/1991 |
| WO | WO-A 88/00096 | 1/1988 |
| WO | WO-A 93/15124 | 8/1993 |

OTHER PUBLICATIONS

"UV-Curing, Science and Technology," (Editor: S.P. Pappas, Technology Marketing Corp., 642 Westover Road, Stamford, Connecticut, USA), 1985.
"Chemistry & Technology of UV & EB Formulations for Coatings, Inks & Paints", vol. 3 (edited by P. K. T. Oldring), 1998.
Organic Chemistry, John McMurry, Fifth edition, 2000, p. 57-61; McGraw-Hill.
Encyclopedia of Science and Technology, vol. 1, p. 50-51.

* cited by examiner

*Primary Examiner*—Susan W Berman

(57) ABSTRACT

Actinic radiation curable compositions comprising at least one actinic radiation curable, cationically polymerizable compound and at least one cationic photoinitiator, may be stabilized by the use of a stabilizer which is a complex of a Lewis acid (other than a fluorine-containing boron compound) and a Lewis base.

12 Claims, No Drawings

ACTINIC RADIATION CURABLE COMPOSITIONS AND THEIR USE

CROSS REFERENCES TO RELATED APPLICATIONS

This application is the National Phase of International Application PCT/GB03/02410 filed Jun. 4, 2003 which designated the U.S. and was published in English and which claims priority to G.B. Pat. App. No. 0212977.3, filed Jun. 6, 2002. The noted applications are incorporated herein by reference.

The present invention relates to actinic radiation curable compositions and their use.

Curable compositions containing epoxy resins are very well known. Many are heat curable. For example, U.S. Pat. Nos. 4,341,819, 5,688,878, 5,780,560, 5,932,288 and 6,316, 049 describe heat curable compositions containing an epoxy together with a crosslinking agent of the methylenedisalicylic acid type. The cure catalyst in U.S. Pat. No. 6,316,049 may be a $BF_3$:amine complex in which the amine is primary, secondary, or tertiary and has a boiling point of about 106° C. or below.

Actinic radiation curable liquid resins or resin mixtures are very versatile. For example, they can be used as coating compositions, adhesives or photoresists. They may also be used for the manufacture of three-dimensional objects using stereolithography. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition, is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired shape is finished. This green model is, in general, not yet fully cured and must therefore, normally, be subjected to post-curing.

Much work has been put into developing suitable actinic radiation-curable compositions for the uses mentioned above. For example U.S. Pat. No. 5,476,748 describes a novel photosensitive composition comprising an epoxy resin and a cationic photoinitiator therefor together with a cycloaliphatic or aromatic diacrylate and a radical photoinitiator therefor, and an OH-terminated polyether, polyester or polyurethane.

A major problem with actinic radiation curable compositions is that they tend to have low storage stability. Such compositions generally contain a component whose purpose is to initiate curing in the presence of radiation, and this component may be unstable under storage conditions. In such a case, small concentrations of certain species, typically photoacids, can cause the composition to discolour and to gel even if kept under cool dark conditions. Thus, EP 153904A, EP 35969A, EP 44272A, EP 54509A, EP 164314A and U.S. Pat. No. 3,708,296 describe onium salts which may be used as initiators for radiation curable epoxy compositions. These salts are highly effective initiators. However, they have the disadvantage that they can break down on storage to produce small quantities of the corresponding acids which can initiate the curing of the epoxy compound present in the composition. This in turn leads to an increase in viscosity of the composition, and can cause gellation or even actual hardening of the composition in a relatively short period of time.

U.S. Pat. No. 5,665,792 discloses stabilisers for photohardenable epoxy compositions, which have limited solubility in the composition and a density which is different from that of the composition, and which are salts of a Group IA or Group IIA metal ion and a weak acid, the weak acid having a pKa in water of greater than 3.0.

There is a need for stabilizers which will increase the shelf life of actinic radiation curable epoxy compositions without adversely affecting the properties of the compositions, particularly now as new means of dispensing actinic radiation curable compositions are becoming available, for example, piezo ink jet printing.

It is known that certain complexes of boron-containing compounds with amines can be used in epoxy compositions as curing agents. U.S. Pat. No. 6,242,513 discloses epoxy-containing compositions and at least one Lewis acid catalyst. Amongst the materials listed as suitable catalysts are borane-amine complexes and amino complexes of boron halides. The catalyst is preferably present in the composition in an amount of from 0.4% to about 0.8% by weight. U.S. Pat. No. 6,191, 681 describes an electrically conductive composite material including an epoxy together with a Lewis acid catalyst, such as a boron trichloride- or boron trifluoride-amine complex. The complex is used in an amount of about 4% by weight based on epoxy. In all these cases, the boron-amine complex is used as a catalyst, its objective being to initiate curing of the epoxy. Other documents which describe curable compositions containing boron-containing complexes include U.S. Pat. No. 5,124,234, U.S. Pat. No. 5,694,852, U.S. Pat. No. 4,632,891, WO 88/00096, JP 030255185 and JP 560053129. In all of these documents, the complex is used as a curing agent, sometimes but not always in conjunction with a cationic photoinitiator.

It has now been found that certain complexes can act as stabilizers for epoxy compounds and other cationically polymerisable compounds in actinic radiation-curable compositions also containing a cationic photoinitiator, for example an onium compound, provided that the amount of complex is limited appropriately. The fact that they can act as stabilisers, i.e. that they prevent premature curing of the cationically curable compound, is most surprising in view of their well-known use as curing initiators for epoxies.

The invention therefore provides an actinic radiation curable composition comprising:

(A) at least one actinic radiation curable, cationically polymerisable compound;

(B) at least one cationic photoinitiator for component (A); and (C) at least one stabiliser which is a complex of a Lewis acid and a Lewis base, provided that the Lewis acid is not a fluorine-containing boron compound; component (C) being present in the composition in an amount of from 0.001 to 0.3 wt % and the relative amounts of Component (B) and Component (C) being such that the composition is stabilised relative to the corresponding composition in which Component (C) is not present.

Any actinic radiation curable, cationically polymerisable compound may be present in component (A) of a composition according to the invention. Epoxy compounds are preferred, and such epoxy compounds may have an aliphatic, aromatic, cycloaliphatic, araliphatic or heterocyclic structure; they may comprise epoxy groups as side groups, or those groups form part of an alicyclic or heterocyclic ring system. Preferred epoxies are those having an epoxy functionality of greater than or equal to 2. Preferably the composition contains at least 50 wt % of epoxy compound.

There may be mentioned as examples of epoxy resins of the type:

I) Polyglycidyl and poly(β-methylglycidyl) esters obtainable by the reaction of a compound having at least two carboxy groups in the molecule and epichlorohydrin or glycerol dichlorohydrin or β-methyl-epichlorohydrin. The reaction is advantageously effected in the presence of bases.

Aliphatic polycarboxylic acids can be used as compounds having at least two carboxy groups in the molecule. Examples of those polycarboxylic acids are glutaric acid, adipic acid, pimelic acid, suberic acid, azelaic acid, sebacic acid or dimerised linoleic acid.

It is, however, also possible to use cycloaliphatic poly carboxylic acids, such as, for example, tetrahydrophthalic acid, 4-methyltetrahydrophthalic acid, hexahydrophthalic acid or 4-methylhexahydrophthalic acid.

It is also possible to use aromatic polycarboxylic acids, such as, for example, phthalic acid, isophthalic acid, trimellitic acid or pyromellitic acid.

It is likewise possible to use carboxy-terminated adducts, for example of trimellitic acid and polyols, such as, for example, glycerol or 2,2-bis(4-hydroxycyclohexyl)propane.

II) Polyglycidyl or poly(P-methylglycidyl) ethers obtainable by the reaction of a compound having at least two free alcoholic hydroxy groups and/or phenolic hydroxy groups and a suitably substituted epichlorohydrin under alkaline conditions, or in the presence of an acidic catalyst with subsequent alkali treatment. Ethers of that type are derived, for example, from acyclic alcohols, such as ethylene glycol, diethylene glycol and higher poly(oxyethylene) glycols, propane-1,2-diol, or poly (oxypropylene) glycols, propane-1,3-diol, butane-1,4-diol, poly(oxytetramethylene) glycols, pentane-1,5-diol, hexane 1,6-diol, hexane-2,4,6-triol, glycerol, 1,1,1-trimethylolpropane, bistrimethylolpropane, pentaerythritol, sorbitol, and also from polyepichlorohydrins.

They are, however, also derived, for example, from cycloaliphatic alcohols, such as 1,3- or 1,4-dihydroxycyclohexane, bis(4-hydroxycyclohexyl)methane, 2,2-bis(4-hydroxycyclohexyl)propane or 1,1-bis(hydroxymethyl)cyclohex-3-ene, or they possess aromatic nuclei, such as N,N-bis (2-hydroxyethyl)aniline or p,p-bis(2-hydroxyethylamino) diphenylmethane.

The epoxy compounds may also be derived from mononuclear phenols, such as, for example, from resorcinol or hydroquinone, or they are based on polynuclear phenols, such as, for example, bis-(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks.

(III) Poly(N-glycidyl) compounds are, for example, obtainable by dehydrochlorination of the reaction products of epichlorohydrin with amines that comprise at least two amine hydrogen atoms. Those amines are, for example, n-butylamine, aniline, toluidine, m-xylylene diamine, bis(4-aminophenyl)methane or bis(4-methy-laminophenyl)methane.

The poly(N-glycidyl) compounds also include, however, N,N-diglycidyl derivatives of cycloalkyleneureas, such as ethyleneurea or 1,3-propyleneurea, and N,N'-diglycidyl derivatives of hydantoins, such as of 5,5-dimethylhydantoin.

IV) Examples of poly(S-glycidyl) compounds are di-S glycidyl derivatives which are derived from dithiols, such as, for example, ethane-1,2-dithiol or bis(4-mercaptomethylphenyl) ether.

V) Examples of epoxy compounds in which the epoxy groups form part of an alicyclic or heterocyclic ring system are bis(2,3-epoxycyclopentyl) ether, 2,3-epoxycyclopentyl glycidyl ether, 1,2-bis(2,3-epoxycyclopentyloxy)ethane, bis (4-hydroxycyclohexyl)methane diglycidyl ether, 2,2-bis(4-hydroxycyclohexyl)propane diglycidyl ether, 3,4-epoxycyclohexylmethyl-3,4-epoxycyclohexane, 3,4-epoxy-6-methyl-cyclohexylmethyl-3,4-epoxy-6-methylcyclohexanecarboxylate, di-(3,4-epoxycyclohexylmethyl) hexanedioate, di-(3,4-epoxy-6-methyl-cyclohexylmethylenebis(3,4-epoxycyclohexanecarboxylate), ethanediol di-(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

It is, however, also possible to use epoxy resins in which the 1,2-epoxy groups are bonded to different hetero atoms or functional groups. Those compounds include, for example, the N,N,O-triglycidyl derivative of 4-aminophenol, the glycidyl ether glycidyl ester of salicylic acid, N-glycidyl-N' (2-glycidyloxypropyl)-5,5-dimethylhydantoin or 2-glycidyloxy-1,3-bis(5,5-dimethyl-1-glycidylhydantoin-3-yl)propane.

Especially preferred are compositions containing a cycloaliphatic diepoxide, for example bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanediol di-(3,4-epoxycyclohexylmethyl) ether or 2-(3,4-epoxycyclohexyl)-5,5,3-dioxane. The monomer purity of any cycloaliphatic diepoxide is preferably 90% or higher.

Curable commercial epoxy products that can be used herein include: Uvacure 1500, Uvacure 1501, Uvacure 1502, Uvacure 1530, Uvacure 1531, Uvacure 1532, Uvacure 1533, Uvacure 1534, Uvacure 1561, Uvacure 1562, all commercial products of UCB Radcure Corp., Smyrna, Ga.; UVR-6105, UVR-6100, UVR-6110, UVR-6128, UVR-6200, UVR-6216 of Union Carbide Corp., Danbury, Conn.; the Araldite GY series that is Bisphenol A epoxy liquid resins, the Araldite CT and GT series that is Bisphenol A epoxy solid resins, the Araldite GY and PY series that is Bisphenol F epoxy liquids, the cycloaliphatic epoxides Araldite CY 179 and PY 284, the Araldite DY and RD reactive diluents series, the Araldite ECN series of epoxy cresol novolacs, the Araldite EPN series of epoxy phenol novolacs, all commercial products of Ciba Specialty Chemicals Corp., the Heloxy 48, Heloxy 44, Heloxy 84 and the other Heloxy product line, the EPON product line, all of Shell Corp., the DER series of flexible aliphatic and Bisphenol A liquid or solid epoxy resins, the DEN series of epoxy novolac resins, all commercial products of Dow Corp., Celoxide 2021, Celoxide 2021P, Celoxide 2081, Celoxide 2083, Celoxide 2085, Celoxide 2000, Celoxide 3000, Glycidole, AOEX-24, Cyclomer A200, Cyclomer M-100, Epolead GT-300, Epolead GT-302, Epolead GT-400, Epolead 401, Epolead 403, (Daicel Chemical Industries Co., Ltd.), Epicoat 828, Epicoat 812, Epicoat 872, Epicoat CT 508, (Yuka Shell Co., Ltd.), KRM-2100, KRM-2110, KRM-2199, KRM-2400, KRM-2410, KRM-2408, KRM-2490, KRM-2200, KRM-2720, KRM-2750 (Asahi Denka Kogyo Co., Ltd.).

In addition, liquid pre-reacted adducts of such epoxy resins with hardeners are suitable for use as component (A).

Cationically curable cyclic compounds other than epoxies which may be used in the compositions of the invention include oxetanes, oxolanes, cyclic acetals, anhydrides, cyclic lactones, thiiranes, and thiotanes. Typical oxetane compounds include trimethylene oxide, 3,3-dimethyloxetane and 3,3-dichloromethyloxetane, 3-ethyl-3-phenoxymethyloxetane, and bis(3-ethyl-3-methyloxy)butane. Typical oxolane compounds include tetrahydrofuran and 2,3-dimethyl-tetrahydrofuran. Typical cyclic acetal compounds include trioxane, 1,3-dioxalane and 1,3,6-trioxan cycloctane. Typical cyclic lactone compounds include β-propiolactone and ε-caprolactone. Typical anhydrides include phthalic anhydride and terephthalic anhydride and hydroxy-containing derivatives thereof. Typical thiirane compounds include ethylene sulphide, 1,2-propylene sulphide and thioepichlorohydrin. Typical thiotane compounds include 1,3-propylene sulphide and 3,3-dimethylthiothane.

Vinyl ethers that can be used as a cationically polymerisable compound in the compositions of the invention include ethyl vinylether, n-propyl vinylether, isopropyl vinylether, n-butyl vinylether, isobutyl vinylether, octadecyl vinylether, cyclohexyl vinylether, butanediol divinylether, cyclohexanedimethanol divinylether, diethyleneglycol divinylether, triethyleneglycol divinylether, tert-butyl vinylether, tert-amyl vinylether, ethylhexyl vinylether, dodecyl vinylether, ethyleneglycol divinylether, ethyleneglycolbutyl vinylether, hexanediol divinylether, triethyleneglycol methylvinylether, tetraethyleneglycol divinylether, trimethylolpropane trivinylether, aminopropyl vinylether, diethylaminoethyl vinylether, ethylene glycol divinyl ether, polyalkylene glycol divinyl ether, alkyl vinyl ether and 3,4-dihydropyran-2-methyl 3,4-dihydropyran-2-carboxylate. Commercial vinyl ethers include the Pluriol-E200 divinyl ether (PEG200-DVE), poly-THF290 divinylether (PTHF290-DVE) and polyethyleneglycol-520 methyl vinylether (MPEG500-VE) all of BASF Corp.

Hydroxy-functionalised mono(poly)vinylethers include polyalkyleneglycol monovinylethers, polyalkylene alcohol-terminated polyvinylethers, butanediol monovinylether, cyclohexanedimethanol monovinylether, ethyleneglycol monovinylether, hexanediol monovinylether, diethyleneglycol monovinylether.

Another class of vinyl ethers that are suitable for inclusion in the compositions according to the invention are all those included in U.S. Pat. No. 5,506,087, which is incorporated herein by reference. More preferred are aromatic or alicyclic vinyl ethers. As an example, commercial vinylethers include Vectomer 4010, Vectomer 5015, Vectomer 4020, Vectomer 21010 and Vectomer 2020 of Allied Signal Corp., Morristown, N.J. Most preferred are Vectomer 4010 and Vectomer 5015.

Other cationically polymerisable compounds include spiro ortho esters that are prepared by reacting epoxy compounds with lactone; and other ethylenically unsaturated compounds, such as vinylcyclohexane, N-vinyl-2-pyrrolidone and its various derivatives, isobutylene and polybutadiene, and derivatives of the above compounds.

A mixture of two or more different cationically polymerisable compounds may be present in the composition of the invention, depending upon the intended use.

Component (B) is preferably an onium salt with an anion of weak nucleophilicity. Examples are halonium salts, iodosyl salts or sulphonium salts, for example those described in EP 153904A, sulphoxonium salts, for example those described in EP 35969A, EP 44272A, EP 54509A and EP 164314A, and diazonium salts, for example those described in U.S. Pat. No. 3,708,296. An overview of further known onium salt initiators is offered by "UV-Curing, Science and Technology", (Editor: S. P. Pappas, Technology Marketing Corp., 642 Westover Road, Stamford, Conn., USA) or "Chemistry & Technology of UV & EB Formulations for Coatings, Inks & Paints", Vol. 3 (edited by P. K. T. Oldring). All of these are incorporated herein by reference.

Preferred compositions comprise, as a cationic photoinitiator, a compound of the formula (I), (II) or (III)

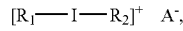

(I)

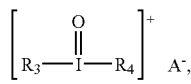

(II)

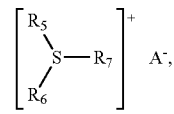

(III)

in which each of $R_1$, $R_2$, $R_3$, $R_4$, $R_5$, $R_6$, and $R_7$ independently of one another are $C_6$-$C_{18}$aryl which is unsubstituted or substituted by appropriate radicals, and $A^-$ is $CF_3SO_3^-$ or, preferably, an anion of the formula $[LQ_m]^-$, where L is boron, phosphorus, arsenic or antimony, Q is a halogen atom, or some of the radicals Q in an anion $LQ_m^-$ may also be hydroxyl groups, and m is an integer corresponding to the valency of L enlarged by 1.

Examples of $C_6$-$C_{18}$aryl in this context are optionally substituted phenyl, naphthyl, anthryl and phenanthryl. Suitable optional substituents include alkyl, preferably $C_1$-$C_6$alkyl, such as methyl, ethyl, n-propyl, isopropyl, n-butyl, sec-butyl, isobutyl, tert-butyl or the various pentyl or hexyl isomers, alkoxy, preferably $C_1$-$C_6$alkoxy, such as methoxy, ethoxy, propoxy, butoxy, pentoxy or hexoxy, alkylthio, preferably $C_1$-$C_6$alkylthio, such as methylthio, ethylthio, propylthio, butylthio, pentylthio or hexylthio, halogen, such as fluorine, chlorine, bromine or iodine, amino groups, cyano groups, nitro groups or arylthio, such as phenylthio. Examples of preferred halogen atoms Q are chlorine and, in particular, fluorine. Preferred anions $LQ_m$ are $BF_4^-$, $PF_6^-$, $AsF_6^-$, $SbF_6^-$ and $SbF_5(OH)^-$.

Particularly preferred compositions are those comprising as a cationic photoinitiator a compound of the formula (III), in which $R_5$, $R_6$ and $R_7$ are aryl, aryl being in particular phenyl and/or biphenyl. Commercially available photoinitiators of this type include the bis-sulphonium antimony hexafluoro compounds UVI 6974 and UVI 6976.

Component (C) comprises at least one stabiliser which is a complex (sometimes referred to as a coordination compound) of a Lewis acid and a Lewis base. A Lewis acid is a substance which can accept an electron pair from a base. A Lewis base is a substance which can donate an electron pair. The donated electron pair is then shared between acid and base (see for example Organic Chemistry, John McMurry, Fifth edition, p. 57-61; McGraw-Hill Encyclopedia of Science and Technology, Vol 1, p. 50-51). The Lewis acid may for example be $BX_3$, $AlX_3$, $FeX_3$, $FeX_2$, $ZnX_2$, $TiX_3$ or $TiX_4$ where each X independently represents a C(1-6)alkyl or C(1-6)alkoxy group or a hydrogen, chlorine, bromine, iodine or fluorine atom, provided that when the Lewis acid is $BX_3$ no X represents a fluorine atom. Boron trifluoride has been found to be unsuitable for use in the present invention, being ineffective as a stabilizer, instead acting to cure the composition. Preferably each X is the same. Where X is an alkyl group, it is preferably an ethyl group. Where X is a halogen atom, it is preferably a bromine, iodine or, especially, chlorine atom. Preferably the Lewis acid is $BX_3$, especially $BH_3$ or $BCl_3$, or an iron III halide, especially $FeCl_3$ The Lewis base may for example be ammonia, phosphine, an amine or a phosphine. Preferred amines and phosphines include amines and phosphines of the general formula $$Z(R_8)_3 \quad (IV)$$

in which Z is nitrogen or phosphorus, and each $R_8$ independently represents a hydrogen atom (provided that not more than two R₈ groups represent hydrogen); an alkyl group having from 1 to 20, preferably from 1 to 8, for example from 1 to 4, carbon atoms, optionally substituted by one or more phenyl groups (in which the phenyl group may be optionally substituted by one or more C(1-12) alkyl groups and/or halogen atoms) or C(5-7)cycloalkyl groups; a phenyl group optionally substituted by one or more C(1-12)alkyl groups and/or halogen atoms; or a C(5-7)cycloalkyl group; or two R₈'s together represent an alkylene group having from 4 to 6 carbon atoms one or more of which may be replaced by an oxygen or a sulphur atom; and in which each alkyl, cycloalkyl or phenyl group present in the compound of the formula IV may be optionally substituted by one or more, preferably one or two, groups —Z(R₈)₂.

For example, each $R_8$ may independently represent a C(1-12)alkyl group or a phenyl group.

Preferably the complex is an amine complex.

Such complexes may be made by known methods and many are available commercially. Particular examples of suitable complexes include the following: borane ammoniac complex; borane triethylamine complex; borane tributylphosphine complex; borane trimethylamine complex; borane triphenylphosphine complex; borane tributylamine complex; borane N,N-diethylamine complex; borane N,N-diisopropylethylamine complex; borane dimethylamine complex; borane N-ethyl-N-isopropyl aniline complex; borane 4-methylmorpholine complex; borane 4-ethylmorpholine complex; bis-(triethylborane) 1,6-diaminohexane complex; trichloroborane N,N-dimethyloctylamine complex; trichloroborane triethylamine complex; trichloroborane pyridine complex; trichloroborane benzylamine complex; irontrichloride triethylamine complex; irontrichloride pyridine complex; and irontrichloride N,N-dimethyloctylamine.

Typically the complex contains one equivalent of a Lewis acid per equivalent of Lewis base, for example one equivalent of a compound of formula $BX_3$ per equivalent of amine or phosphine.

Component (C) of the composition according to the invention is present in an amount of from 0.001 to 0.3 wt %, preferably from 0.001 to 0.1 wt %. The optimal amount of component (C) present in any particular composition will depend upon the amount of cationic photoinitiator present in the composition, as well as on the identity of the particular complex and the particular photoinitiator used. In general, the higher the amount of cationic photoinitiator present, the higher the amount of component (C) required to give effective stabilisation. The quantity of component (C) will however be as low as possible as excessive amounts of component (C), far from stabilising the composition, can lead to gelling or even curing of the composition.

The compositions of the present invention may also contain further components depending upon the intended use and desired properties of the compositions. For example, in addition to the cationically polymerisable compound, the compositions according to the present invention also preferably comprise a free radically curable component. This component preferably comprises at least one solid or liquid poly (meth)acrylate, for example, di-, tri-, tetra- or pentafunctional monomeric or oligomeric aliphatic, cycloaliphatic or aromatic acrylates or methacrylates. Such compounds preferably have a molecular weight of from 200 to 500.

Examples of suitable aliphatic poly(meth)acrylates having more than two unsaturated bonds in their molecules are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

It is additionally possible, for example, to use polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl (meth)acrylates to give the urethane (meth)acrylate.

Examples of suitable aromatic tri(meth)acrylates are the reaction products of triglycidyl ethers of trihydric phenols and phenol or cresol novolaks containing three hydroxyl groups, with (meth)acrylic acid.

The (meth)acrylates used herein are known compounds and some are commercially available, for example from the SARTOMER Company under product designations such as SR®295, SR®350, SR®351, SR®367, SR®399, SR®444, SR®454 or SR®9041.

Preferred compositions are those in which the free radically curable component contains a tri(meth)acrylate or a penta(meth)acrylate.

Suitable examples of di(meth)acrylates are the di(meth) acrylates of cycloaliphatic or aromatic diols such as 1,4-dihydroxymethylcyclohexane, 2,2-bis(4-hydroxy-cyclohexyl)propane, bis(4-hydroxycyclohexyl)methane, hydroquinone, 4,4'-dihydroxybi-phenyl., Bisphenol A, Bisphenol F, bisphenol S, ethoxylated or propoxylated Bisphenol A, ethoxylated or propoxylated Bisphenol F or ethoxylated or propoxylated bisphenol S. Di(meth)acrylates of this kind are known and some are commercially available.

Other di(meth)acrylates which can be employed are compounds of the formulae (V), (VI), (VII) or (VIII)

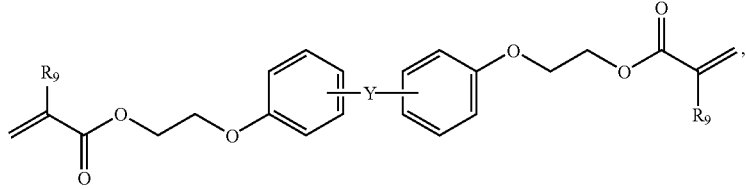

(V)

-continued

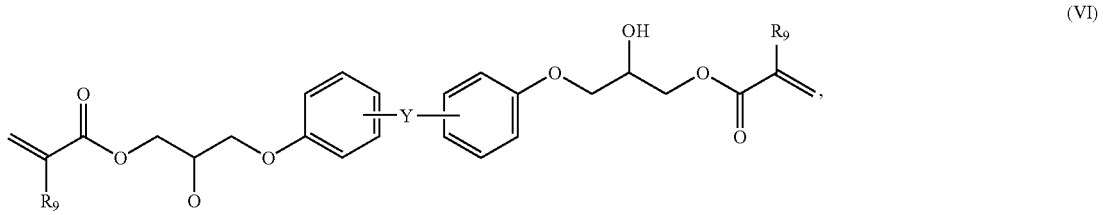

(VI)

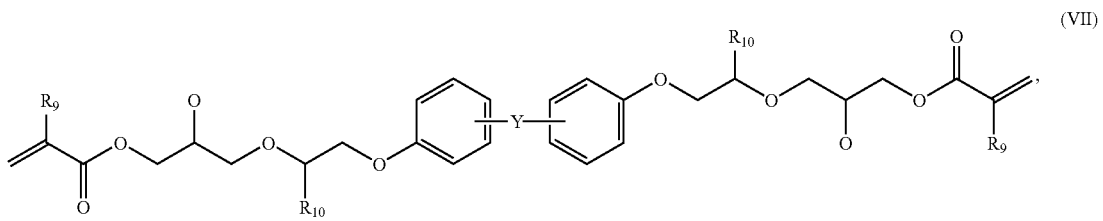

(VII)

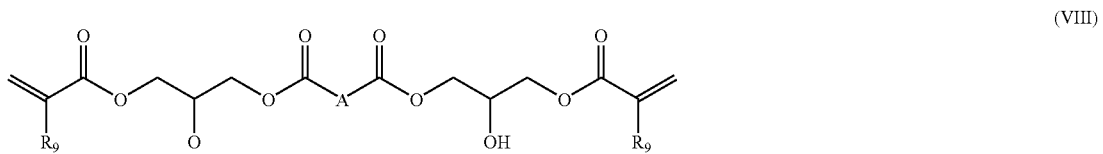

(VIII)

in which $R_9$ is a hydrogen atom or methyl,

Y is a direct bond, $C_1$-$C_6$alkylene, —S—, —O—, —SO—, —SO$_2$— or —CO—, $R_{10}$ is a $C_1$-$C_8$alkyl group, a phenyl group which is unsubstituted or substituted by one or more $C_1$-$C_4$alkyl groups, hydroxyl groups or halogen atoms, or is a radical of the formula —CH$_2$—OR$_{11}$ in which $R_{11}$ is a $C_1$-$C_8$alkyl group or phenyl group, and A is an alkylene group or a group of the formula

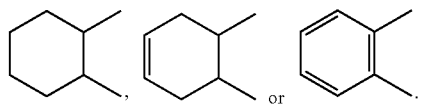

Further examples of possible di(meth)acrylates are compounds of the formulae (IX), (X), (XI) and (XII)

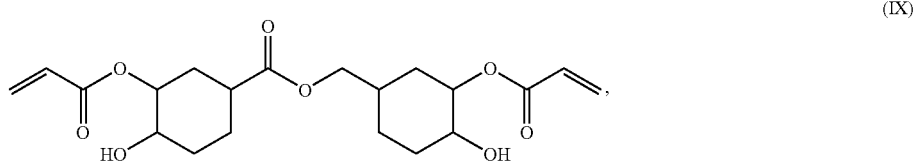

(IX)

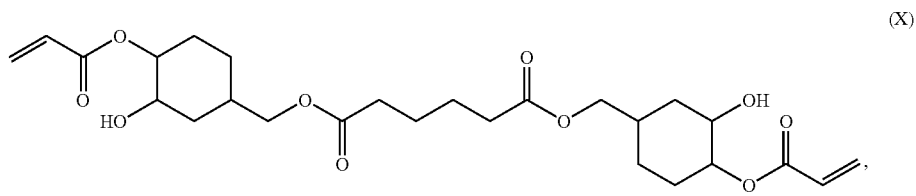

(X)

-continued

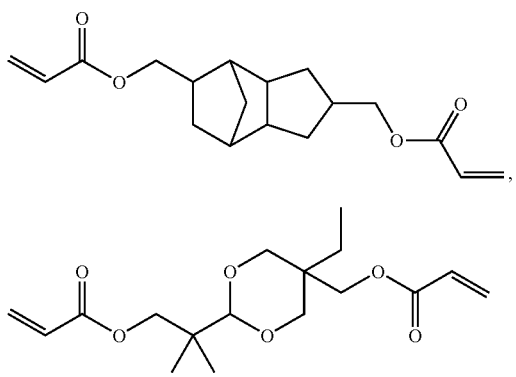

(XI)

(XII)

These compounds of the formulae (V) to (XII) are known and some are commercially available. Their preparation is also described in EP-A-0 646 580.

Examples of commercially available products of these polyfunctional monomers are KAYARAD R-526, HDDA, NPGDA, TPGDA, MANDA, R-551, R-712, R-604, R-684, PET-30, GPO-303, TMPTA, THE-330, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, R-011, R-300, R-205 (Nippon Kayaku Co., Ltd.), Aronix M-210, M-220, M-233, M-240, M-215, M-305, M-309, M-310, M-315, M-325, M-400, M-6200, M-6400 (Toagosei Chemical Industry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

If the composition according to the present invention also comprises a free radically curable component it should also contain at least one free radical initiator. It is possible to employ all types of photoinitiators which form free radicals given the appropriate irradiation. Typical representatives of free-radical photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxy-acetophenone and 1,1-dichloroacetophenone, benzil, benzil ketals, such as benzil dimethylketal and benzil diethyl ketal, anthraquinones, such as 2-methylanthraquinone, 2-ethylanthraquinone, 2-tert-butylanthraquinone, 1-chloroanthraquinone and 2-amylanthraquinone, and also triphenylphosphine, benzoylphosphine oxides, for example 2,4,6-trimethylbenzoyl-diphenylphosphine oxide (Luzirin® TPO), bisacylphosphine oxides, benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propanedione 2-O-benzoyl oxime, 1-aminophenyl ketones or 1-hydroxy phenyl ketones, such as 1-hydroxy-cyclohexyl phenyl ketone, phenyl 1-hydroxyisopropyl ketone and 4-isopropylphenyl 1-hydroxyisopropyl ketone, all of which constitute known compounds. A particularly preferred free radical initiator is Irgacure 184, available from Ciba Speciality Chemicals, which is phenyl 1-hydroxycyclohexyl ketone.

Preferably a composition according to the invention comprises from 20 to 60 wt % of an cationically polymerisable compound; from 0.1 to 10 wt % of cationic initiator; from 5 to 40 wt % of a radically curable component; from 0.1 to 10% of a radical initiator; and from 0.001 to 0.3 wt % of the stabiliser which is a complex of a Lewis acid with a Lewis base.

The compositions according to the invention may also advantageously contain hydroxy compounds, for example as described in U.S. Pat. No. 6,379,866, U.S. Pat. No. 5,629,133 and U.S. Pat. No. 5,972,563, for example hydroxy terminated polyethers, such as polytetrahydrofuran diols and polyols having a molecular weight of about 250 to about 4000, or siloxane/polyethylene oxide copolymers.

The present invention is useful for the stabilisation of compositions such as those described in U.S. Pat. No. 5,476,748, the contents of which are incorporated herein by reference. Accordingly, in a preferred embodiment of the invention, there is provided a composition according to the invention comprising a) from 40 to 80% by weight of at least one liquid epoxy resin having an epoxy functionality of equal to or greater than 2, b) from 0.1 to 10% by weight of at least one cationic photoinitiator for component a), c) from 5 to 40% by weight of at least one liquid diacrylate, d) from 0 to 15% by weight of at least one liquid poly(meth-)acrylate having a (meth-)acrylate functionality of greater than 2, the proportion of component d) preferably constituting a maximum of 50% by weight of the total (meth-)acrylate content, e) from 0.1 to 10% by weight of at least one radical photoinitiator for component c) and, where appropriate, d), f) from 5 to 40% by weight of at least one OH-terminated polyether, polyester or polyurethane, and g) at least one stabiliser which is a complex of a Lewis acid and a Lewis base, the Lewis acid being other than a fluorine-containing boron compound; component (g) being present in the composition in an amount of from 0.001 to 0.3 wt %, and the relative amounts of Component (b) and Component (g) being such that the composition is stabilised relative to the corresponding composition in which Component (g) is not present.

The compositions according to the invention can further include customary additives for epoxy compositions, such as colouring agents, such as pigments and dyes, antifoaming agents, leveling agents, thickening agents, flame retardants, antioxidants and fillers such as silica, alumina, glass powder, ceramic powder and metal powder.

The novel compositions of the present invention can be prepared in a known manner by, for example, premixing individual components and then mixing these premixes, or by mixing all of the components using customary devices, such as stirred vessels, in the absence of light and, if desired, at slightly elevated temperature. The physical form of the composition will depend upon the intended application, and may for example be a powder, a paste, or a liquid.

The novel compositions can be polymerized by irradiation with actinic radiation, for example by means of electron beams, X-rays, UV or VIS light, preferably with radiation in the wavelength range of 280-650 nm. Particularly suitable are laser beams of HeCd, argon or nitrogen, metal vapour lasers, and NdYAG lasers and their frequency doubled or trebled counterparts.

The invention additionally relates to a method of producing a cured product, which comprises treating a composition according to the invention with actinic radiation. For example, it is possible in this context to use the novel compositions as adhesives, for example in DVD manufacture, as coating compositions, as photoresists, for example as solder resists, for rapid prototyping, for example by stereolithography or by ink jet printing, or for inkjet printing for producing visual or non-visual markings on any substrates. The present invention is particularly useful in the field of compositions for use in stereolithography. The requirements for compositions for use in this field are challenging. Liquid compositions for stereolithography usually have a low viscosity, but because the compositions generally contain an initiator which generates a strong acid, maintaining this low viscosity on storage is difficult. Where the stereolithography composition is a paste, control of viscosity is also very important and premature curing can be a major problem. The present invention is also particularly useful in the field of inkjet printing. Here, jetting of the composition is often carried out at elevated temperature, and premature gelling or thickening of the printing composition can be a particular problem, leading to blockage of the printing jets. It is an advantage of the present invention that stabilisation is obtained not only at room temperature or below, but also at elevated temperatures, for example those used during inkjet printing, typically around 65° C.

When the novel compositions according to the invention are employed as coating compositions, the resulting coatings on wood, paper, metal, ceramic, glass, or other surfaces are clear and hard. The coating thickness may vary greatly and can for instance be from 0.01 mm to about 1 mm. Specific coating applications include the coating of optical fibres, and the production of marine coatings. Using the novel compositions it is possible to produce relief images for printed circuits or printing plates directly by irradiation of the mixtures, for example by means of a computer-controlled laser beam of appropriate wavelength or employing a photomask and an appropriate light source. Alternatively, the compositions may be printed using piezo ink jet technology directly onto printing plates or circuit boards, and cured by overall or selective irradiation.

The invention further provides the use of a complex of a Lewis acid and a Lewis base (wherein the Lewis acid is other than a fluorine-containing boron compound) as a stabiliser for a composition containing at least one actinic radiation curable, cationic ring opening compound and at least one cationic photoinitiator for said cationically polymerisable compound. The invention further provides a process for the stabilization of a composition containing (A) at least one actinic radiation curable, cationically polymerisable compound; and
(B) at least one cationic photoinitiator for component A); which comprises admixing with said components (A) and (B), a complex of a Lewis acid and a Lewis base (the Lewis acid being other than a fluorine-containing boron compound) in an amount such that the composition is stabilised in relation to the corresponding composition not containing said complex.

The following Examples illustrate the invention.

In Examples 1 to 23, the use of boron trichloride/dimethyloctylamine complex (DY9577, from Vantico Ltd) as a viscosity stabiliser in cationic formulations is exemplified, and compared to the resin without stabiliser. Examples 24 to 41 illustrate the use of further boron-containing complexes, while Examples 42 to 44 illustrate the use of iron-containing complexes. Examples 54 to 59 are comparative examples.

EXAMPLE 1

180 g of 3,4-epoxycyclohexylmethyl-3,4-epoxycyclohexane carboxylate (Uvacure 1500, manufactured by Dow Chemicals) was mixed with 20 g of mixed triarylsulfonium hexafluoroantimonate salts in 50% by weight propylene carbonate (Cyracure 6976, supplied by Dow Chemicals). This liquid composition 1 was then used in examples 2-5, 36-41 and 45-53.

EXAMPLE 2

To 20 g of liquid composition 1 was added 4.1 mg of DY9577 (MW=275.15 g/mol) in a brown Nalgene bottle. The mixture was stirred on a roller mixer for 5 hours at room temperature. In Example 2, the liquid composition 1 contains 204 parts per million of DY9577 (0.0204 wt %; 0.74 mmol per kilogram of resin).

EXAMPLES 3 AND 4

Mixtures characterised by the compositions listed in table 1 were prepared as in example 2. The quantitative data in table 1 are wt %. For comparison purposes, the amount of stabiliser is also given in mmol per kilogram of resin (mmol/kg).

TABLE 1

| Example No. | DY9577 wt % (mmol/kg) |
|---|---|
| 3 | 0.041 (1.49) |
| 4 | 0.055 (2.00) |

Liquid composition 1 and examples 2 to 4 (contained in sealed, brown Nalgene bottles) were placed in an oven at 65° C. to perform accelerated ageing. The viscosity was measured every 2-3 days (Brookfield DVII2, HB, cone and plate, Spindle S40, 10 rpm). Viscosities at 25° C. (mPa·s) are reported in table 2. Liquid composition 1 was chosen as a general cationic photocurable composition to demonstrate the stabilising effect of DY9577. Accelerated ageing at 65° C. reveals how stable/unstable a liquid composition can be upon storage. When applied to kinetically controlled reaction rates, the Arrhenius equation predicts that a 10° C. increase in temperature will double the reaction rate. A 2-week stability test at 65° C. is equivalent to over 7 months storage at 25° C.

TABLE 2

|  | day | | |
|---|---|---|---|
|  | 0 | 3 | 9 |
| Liquid composition 1 (comparison) | 238 | 311 | 24300 |
| Example 2 | 238 | 320 | 1000 |
| Example 3 | 238 | 299 | 880 |
| Example 4 | 238 | 294 | 820 |

As shown here, when used in small amounts, far from initiating the polymerisation of the epoxies, DY9577 slows down significantly the ageing process of the cycloaliphatic epoxy in the presence of a cationic photoinitiator at 65° C. This is a most unusual result, as DY9577 is a latent thermal catalyst for epoxies.

EXAMPLE 5

The liquid composition 2 described in Table 3 was the base for experiments performed to assess the performance of DY9577 as a viscosity stabiliser in a typical photocurable composition used in stereolithography.

TABLE 3

| Class of compound | Commercial name | Manufacturer | Wt % |
|---|---|---|---|
| Cycloaliphatic epoxide | Uvacure 1500 | Dow Chemicals | 48.5 |
| Glycidyl ethers | Heloxy 48 | Resolution | 11.0 |
|  | Heloxy 84 | Resolution | 6.1 |
| Acrylates | SR399 | Sartomer | 6.1 |
|  | Ebecryl 3700 | UCB chemicals | 6.3 |
| polyol | Terathane 1000 | Du Pont | 15.0 |
| Free-radical Photoinitiator | Irgacure 184 | Ciba SC | 2.0 |
| Cationic Photoinitiator | Cyracure 6976 | Dow Chemicals | 5.0 |

The components were stirred at 60° C. until a clear homogeneous mixture formed.

EXAMPLE 6

To 31.1 g of liquid composition 2 was added 6.3 mg of DY9577 (MW=275.15 g/mol) in a brown nalgene bottle. The mixture was stirred on a roller mixer for 5 hours at room temperature. In Example 6, the liquid composition 2 contains 203 parties per million of DY9577 (0.0203 wt %; 0.74 mmol per kilogram of resin).

EXAMPLES 7-17

Mixtures characterised by the compositions listed in table 2 were prepared as in example 6. The quantitative data in table 4 are weight percent (wt %). For comparison purposes, the amount of stabiliser is also given in mmol per kilogram of resin (mmol/kg).

TABLE 4

| Example No. | DY9577 wt % (mmol/kg) |
|---|---|
| 7 | 0.0407 (1.48) |
| 8 | 0.0548 (1.99) |
| 9 | 0.0680 (2.47) |
| 10 | 0.0800 (2.91) |

TABLE 4-continued

| Example No. | DY9577 wt % (mmol/kg) |
|---|---|
| 11 | 0.0961 (3.49) |
| 12 | 0.108 (3.94) |
| 13 | 0.152 (5.52) |
| 14 | 0.200 (7.26) |
| 15 | 0.300 (10.89) |
| 16 (comparison) | 0.499 (18.14) |
| 17 (comparison) | 1.000 (36.31) |

The photospeed of the compositions listed in table 4 were determined using methods well known in the art, using a SLA apparatus (SLA 7000 3D-Systems). Depth of Penetration (Dp, in mils) and Critical Exposure (Ec, in mj/cm$^2$) are given in table 5. Also listed are E4 and E11, the energies respectively needed to cure layers of 4 and 11 mils of thickness.

TABLE 5

| Composition | Dp (mils) | EC (mj/cm$^2$) | E4 (mj/cm$^2$) | E11 (mj/cm$^2$) |
|---|---|---|---|---|
| Liquid composition 2 (comparison) | 5.09 | 7.43 | 16.31 | 64.591 |
| Example 6 | 4.87 | 6.95 | 15.796 | 66.425 |
| Example 7 | 5.13 | 7.77 | 16.954 | 66.387 |
| Example 8 | 5.19 | 7.82 | 16.891 | 65.043 |
| Example 9 | 4.88 | 6.73 | 15.293 | 64.251 |
| Example 10 | 5.11 | 7.56 | 16.531 | 65.070 |
| Example 11 | 5.02 | 7.43 | 16.488 | 66.561 |
| Example 12 | 5.05 | 7.65 | 16.882 | 67.534 |
| Example 13 | 4.94 | 7.08 | 15.921 | 65.731 |
| Example 14 | 4.97 | 7.27 | 16.242 | 66.372 |
| Example 15 | 4.94 | 7.10 | 15.961 | 65.889 |

The data gathered in Table 5 show that the boron-amine complex does not significantly affect the photospeed of the stereolithography resin. This is a crucial result. Due to their basic character viscosity stabilisers are expected to reduce the photospeed of UV-curable resins. Finding a viscosity stabiliser that will capture the acid species created upon ageing without affecting the cure properties of the resin is a real breakthrough.

EXAMPLE 18

Thermal ageing at 65° C. was performed on the compositions of examples 6-17. Samples were placed in sealed brown Nalgene bottles at 65° C. The viscosities measured every 2-3 days are reported in table 6.

The accelerated ageing at 65° C. shows very clearly that small amounts of DY9577 are very effective at slowing down the ageing process of liquid composition 2. Without any stabiliser, the resin gels after 11 days at 65° C., whereas small amounts of DY9577 increases its storage stability, slowing down the ageing process and deferring the gelling time. However, increasing the amount of DY9577 represents a danger, as shown in comparative examples 16 and 17, containing 0.5 and 1.0 wt % of the stabiliser. At these levels, DY9577 does not act as a stabiliser any longer, but acts as a thermal catalyst and induces gelling within a day.

TABLE 6

| | Day | | | | | | | | | | | | | |
|---|---|---|---|---|---|---|---|---|---|---|---|---|---|---|
| | 0 | 1 | 3 | 4 | 5 | 6 | 7 | 8 | 10 | 11 | 13 | 14 | 17 | 24 |
| Liq. comp. 2 (comparison) | 421 | 437 | | 591 | | 2420 | 8850 | | | gel | | | | |
| Ex. 6 | 450 | | | | | | 528 | | 567 | | 602 | | | |
| Ex. 7 | 429 | | 450 | | | | | | | | | 450 | | 497 |
| Ex. 8 | 426 | | 450 | | | | | | | | | 453 | | 484 |
| Ex. 9 | 426 | | 450 | | | | | | | | | 458 | | 487 |
| Ex. 10 | 450 | | | | | | 468 | | | | | | | 910 |
| Ex. 11 | 450 | | | | | | 466 | | | | 520 | | | 528 |
| Ex. 12 | 450 | | | | | | 481 | | | | 546 | | | 529 |
| Ex. 13 | 460 | 466 | | | | | 534 | | | | | 518 | | 570 |
| Ex. 14 | 460 | 476 | | | | | 544 | | | | | 544 | | 600 |
| Ex. 15 | 460 | 505 | | | | | 583 | | | | | 600 | | 680 |
| Ex. 16 (comparison) | 460 | Partial gel | | | | | | | | | | | | |
| Ex. 17 (comparison) | 460 | partial gel | | | | | | | | | | | | |

EXAMPLE 19-21

Green flexural modulus (GFM) of liquid composition 2, example 7 and example 9 were measured. 150 g of resin were placed in a small tub and 3 flexural bars (2.66×6.23×40 mm) were built with a SLA 7000 (3D-Systems). The flexural modulus at 1 mm deflection is measured 10 min and 1 hour after the end of the build. The 3rd bar is kept for 48 hours at 25° C., 50% relative humidity, and UV-cured for 90 min in a PCA oven. The green flexural modulus in MPa after 10 min, 1 hour, and after UV-curing are given in table 7.

TABLE 7

| | 10 min-GFM | 1 h-GFM | UV-cured |
|---|---|---|---|
| Liquid composition 2 | 17 | 85 | 1430 |
| Example 7 | 19 | 84 | 1470 |
| Example 9 | 14 | 78 | 1460 |

This example demonstrates that DY9577 used in an appropriate amount does not affect the green strength of a stereolithography part. Green strength is a major property in stereolithography: the parts built by this process must be strong enough to stand without collapsing under their own weight and to be removed from the metallic platform on which they have been built without damage. DY9577 does not affect the photospeed, the green strength or the final flexural modulus of the cured material, as compared to the non-modified resin, and does increase the storage stability of the liquid resin.

EXAMPLE 22

The liquid composition 3 described in Table 8 is used in a test designed to mimic the formation of free acid in a vat in a SLA apparatus. The viscosity of the liquid composition 3 is 380 mPa·s at 25° C., and the epoxy value is 5.86 mol/kg.

TABLE 8

| Class of compound | Commercial name | Manufacturer | wt % |
|---|---|---|---|
| Cycloaliphatic epoxide | Uvacure 1500 | Dow Chemicals | 50.2 |
| Glycidyl ethers | Heloxy 48 | Resolution | 30.0 |
| Acrylates | SR399 | Sartomer | 6.2 |
| | Ebecryl 3700 | UCB chemicals | 6.3 |

TABLE 8-continued

| Class of compound | Commercial name | Manufacturer | wt % |
|---|---|---|---|
| Free-radical Photoinitiator | Irgacure 184 | Ciba SC | 2.5 |
| Cationic Photoinitiator | Cyracure 6976 | Dow Chemicals | 5.0 |

437 g of liquid composition 3 are placed in a small plastic tub. A 3-dimension part made of fine supports, referred to as the "sponge part" is built with a SLA 7000 (3D-Systems). Ideally, the part occupies the largest possible volume of the small tub of resin. When building the fine part, the laser will also slightly irradiate the surrounding liquid resin thus producing unwanted acid species that can start polymerising the epoxy monomers. The fine structure of the test part is designed to amplify this effect resulting in increased viscosity. In total, three sponge parts are built in the same resin, at 24 hour intervals, and the viscosity of the resin is measured just before the following test (23 hours after the end of the previous build), after draining the previous test part (Table 9). Epoxy values also confirm that the increased viscosity is due to the uncontrolled polymerisation of the epoxide monomers (decreasing epoxy value after several sponge tests).

TABLE 9

| | Viscosity at 25° C. (mPa · s) | Epoxy value (mol/kg) |
|---|---|---|
| Before test | 380 | 5.86 |
| 23 h after 1 sponge | 460 (+21%) | 5.78 |
| 23 h after 2 sponges | 680 (+79%) | 5.65 |
| 23 h after 3 sponges | 1375 (+262%) | 5.58 |

EXAMPLE 23

To 471.7 g of liquid composition 3 were added 373 mg of DY9577 (0.079 wt %; 2.87 mmol/kg). The mixture was stirred for 1 hour before 437 g were placed in a tub and the experiment described in example 25 was repeated. The results are reported in Table 10.

TABLE 10

| | Viscosity at 25° C. (mPa · s) | Epoxy value (mol/kg) |
|---|---|---|
| Before test | 380 | 5.86 |
| 23 h after 1 sponge | 400-415 (+5-9%) | |
| 23 h after 2 sponges | 500-525 (+31-38%) | |
| 23 h after 3 sponges | 580 (+53%) | 5.75 |

Examples 22 and 23 show the remarkable effect of DY9577 as a viscosity stabiliser. The increase in viscosity for the resin stabilised with 0.079 wt % of DY9577 is much less dramatic than the original resin. The decrease in the epoxy value further demonstrates that the viscosity rise is due to the gelling of the epoxides.

EXAMPLES 24-35

The liquid composition 2 described in example 5 was used to assess the performance of borane trimethylamine ($BH_3$/$NMe_3$) complex. Mixtures characterised by the compositions listed in table 11 were prepared as in example 2. The quantitative data in table 11 are wt %. For comparison purposes, the amount of stabiliser is also given in mmol per kilogram of resin (mmol/kg).

TABLE 11

| Example No. | $BH_3$/$NMe_3$ wt % (mmol/kg) |
|---|---|
| 24 | 0.0109 (1.49) |
| 25 | 0.0183 (2.50) |
| 26 | 0.0286 (3.92) |
| 27 | 0.0309 (4.24) |
| 28 | 0.0474 (6.50) |
| 29 | 0.0732 (10.03) |

Thermal ageing at 65° C. was performed on the compositions of examples 24-29 as described in example 18. The viscosities are reported in table 12. These examples show that $BH_3$/$NMe_3$ is as good as DY9577 and prevents the thermal cure of the epoxide.

TABLE 12

| | Day | | | | |
|---|---|---|---|---|---|
| | 0 | 2 | 6 | 9 | 15 |
| Liq. Comp. 2 (comparison) | 473 | 500 | 1000 | 1800 | gel |
| Ex. 24 | 456 | 445 | 458 | 524 | 600 |
| Ex. 25 | 470 | 463 | 470 | 491 | 475 |
| Ex. 26 | 458 | 463 | 466 | 511 | 500 |
| Ex. 27 | 458 | 452 | 453 | 510 | 500 |
| Ex. 28 | 472 | 420 | 479 | 490 | 500 |
| Ex. 35 | 472 | 458 | 490 | 520 | 550 |

EXAMPLES 36-41

The liquid composition 1 described in example 1 was used to assess the performance of 2 other commercial borane/amine complexes and borane/phosphine complexes. Borane tributylphosphine ($BH_3$/$PBu_3$) and borane ammoniac ($BH_3$/$NH_3$) complexes were bought from Aldrich. Mixtures characterised by the compositions listed in table 13 were prepared as in example 2. The quantitative data in table 13 are wt %. For comparison, the amount of stabiliser is also given in mmol per kilogram of resin (mmol/kg).

TABLE 13

| Example No. | $BH_3$/$PBu_3$ wt % (mmol/kg) | $BH_3$/$NH_3$ wt % (mmol/kg) |
|---|---|---|
| 36 | 0.0320 (1.48) | |
| 37 | 0.0870 (4.01) | |
| 38 | 0.216 (10.00) | |
| 39 | | 0.0046 (1.48) |
| 40 | | 0.0123 (3.98) |
| 41 | | 0.0309 (10.0) |

Thermal ageing at 65° C. has been performed on the compositions of examples 36-41 as described in example 18. The viscosities are reported in table 14.

TABLE 14

| | Day | | |
|---|---|---|---|
| | 0 | 3 | 6 |
| Liq. Comp. 1 (comparison) | 203 | 1180 | 20000 |
| Ex. 36 | 205 | 216 | 301 |
| Ex. 37 | 205 | 213 | 204 |
| Ex. 38 | 205 | 211 | 211 |
| Ex. 39 | 205 | 495 | 1055 |
| Ex. 40 | 205 | 205 | 293 |
| Ex. 41 | 205 | 249 | 298 |

EXAMPLES 42-44

Synthesis of iron trichloride/amine Complexes

EXAMPLE 42

Iron trichloride dimethyloctylamine Complex ($FeCl_3$/$N(CH_3)_2$ ($C_8H_{17}$) Complex)

Solution 1: 0.382 g of $FeCl_3$ (2.355 mmol) is weighed in a small jar and 9.918 g of $CHCl_3$ are added (3.7 wt % of $FeCl_3$ in solvent).

Solution 2: 0.373 g of $N(CH_3)_2$ ($C_8H_{17}$) (2.37 mmol) are weighed in a jar and dissolved in 10.09 g of $CHCl_3$ (3.6 wt % in solvent).

Solution 2 is added dropwise at room temperature to solution 1 while stirring. The formation of the complex results in solubilisation of $FeCl_3$ and the mixture becomes red-brown. Stirring is maintained during 1 hour before the solvent is removed under reduced pressure. The material is dried under reduced pressure at room temperature until the weight remains constant. $FeCl_3$/$N(CH_3)_2$($C_8H_{17}$) is a red-brown viscous liquid, with an unpleasant odour. Final weight: 0.72 g (yield=92%)

EXAMPLE 43

Iron trichloride pyridine Complex ($FeCl_3$/pyridine Complex)

Solution 1: 0.541 g of $FeCl_3$ (3.33 mmol) in $CHCl_3$ (2.8 wt % solution)

Solution 2: 0.265 g of pyridine (3.35 mmol) in $CHCl_3$ (5.8 wt % solution)

Solution 2 is added to solution 1 in the same manner as in example 42. $FeCl_3$/pyridine complex is a yellow powder, filtered off on a No. 4 filter paper, and rinsed with CHCl$_3$ until CHCl$_3$ remains uncolored. FeCl$_3$/pyridine complex has a melting point of 113-116° C. Final weight: 0.515 g (yield=64%)

EXAMPLE 44

Iron trichloride triethylamine Complex (FeCl$_3$/NEt$_3$ Complex)

Solution 1: 0.492 g of FeCl$_3$ (3.03 mmol) in CHCl$_3$ (3 wt % solution)
Solution 2: 0.308 g of NEt$_3$ (3.04 mmol) in CHCl$_3$ (5.2 wt % solution)
Solution 2 is added to solution 1 in the same manner as in example 42. The FeCl$_3$/NEt$_3$ complex is a dark red oil floating at the surface of CHCl$_3$. The solvent is evaporated as in example 42. FeCl$_3$/NEt$_3$ complex is a dark red viscous liquid with an unpleasant odour. Final weight: 0.72 g (yield=90%).

These three new complexes are used in the following examples to demonstrate that FeCl$_3$/amines are suitable complexes for the invention.

EXAMPLES 45-53

The liquid composition 1 described in example 1 was used to assess the performance of new iron trichloride/amine complexes as stabilisers in cationically curable compositions. Mixtures characterised by the compositions listed in table 15 were prepared as in example 2. The quantitative data in table 15 are wt %. For comparison purposes, the amount of stabiliser is also given in mmol per kilogram of resin (mmol/kg).

TABLE 15

| Example No. | FeCl$_3$/N(CH$_3$)$_2$(C$_8$H$_{17}$) wt % (mmol/kg) | FeCl$_3$/pyridine wt % (mmol/kg) | FeCl$_3$/NEt$_3$ wt % mmol/kg) |
|---|---|---|---|
| 45 | 0.047 (1.46) | | |
| 46 | 0.128 (4.00) | | |
| 47 | 0.320 (10.00) | | |
| 48 | | 0.040 (1.50) | |
| 49 | | 0.106 (4.02) | |
| 50 | | 0.263 (9.99) | |
| 51 | | | 0.036 (1.48) |
| 52 | | | 0.095 (3.93) |
| 53 | | | 0.241 (9.98) |

Thermal ageing at 65° C. has been performed on the compositions of examples 45-53 as described in example 18. The viscosities are reported in table 16. Examples 45 to 53 show that iron trichloride/amine complexes are effective viscosity stabilisers for cationically curable resins.

TABLE 16

| | Day | | |
|---|---|---|---|
| | 0 | 3 | 6 |
| Liq. Comp. 1 (comparison) | 203 | 1180 | 20000 |
| Ex. 45 | 207 | 217 | 247 |
| Ex. 46 | 205 | 246 | 242 |
| Ex. 47 | 203 | 249 | 277 |
| Ex. 48 | 205 | 226 | 621 |
| Ex. 49 | 205 | 246 | 252 |
| Ex. 50 | 206 | 240 | 245 |
| Ex. 51 | 205 | 231 | 486 |
| Ex. 52 | 205 | 247 | 249 |
| Ex. 53 | 206 | 310 | 322 |

EXAMPLES 54 TO 59 (COMPARISON)

The method of Examples 24 to 35 was repeated using boron trifluoride-ethylamine complex. The results are shown in Table 17.

TABLE 17

| Example No. | BF$_3$/NH$_2$Et wt % (mmol/kg) | Viscosity at 0 days | Viscosity at 2 days |
|---|---|---|---|
| Liq. Comp. 2 (comparison) | 0 | 473 | 500 |
| 54 | 0.0167 (1.48) | 480 | 877 |
| 55 | 0.0283 (2.51) | 466 | 1130 |
| 56 | 0.0393 (3.48) | 472 | 1520 |
| 57 | 0.0507 (4.49) | 485 | |
| 58 | 0.0793 (7.03) | 458 | 4450 |
| 59 | 0.1187 (10.51) | 472 | 1500 |

The results plainly show that compositions containing boron trifluoride complexes are relatively unstable in comparison to compositions according to the invention.

The invention claimed is:

1. An actinic radiation curable composition comprising:
   (A) 40-80 weight % of at least one liquid epoxy resin having an epoxy functionality of 2 or greater;
   (B) 0.1-10 weight % of at least one cationic photoinitiator;
   (C) 5-40 weight % of at least one liquid diacrylate;
   (D) 0-15 weight % of at least one liquid poly(meth) acrylate having a (meth)acrylate functionality of greater than 2;
   (E) 0.1-15 weight % of at least one radical photoiniator;
   (F) 5-40 weight % of at least one OH-terminated polyether, OH-terminated polyester or OH-terminated polyurethane; and
   (G) 0.001-0.3 weight % of at least one stabilizer selected from the group consisting of borane ammoniac complex, borane triethylamine complex, borane tributylphosphine complex, borane trimethylamine complex, borane triphenylphosphine complex, borane tributylamine complex, borane N,N-diethylamine complex, borane N,N-diisopropyl ethylamine complex, borane dimethylamine complex, borane N-ethyl-N-isopropyl aniline complex, borane 4-methyl-morpholine complex, borane 4-ethylmorpholine complex, bis-(triethylborane) 1,6-diaminohexane complex, trichloroborane N,N-dimethyloctylamine complex, trichloroborane N,N-dimethyloctylamine complex, trichloroborane triethylamine complex, trichloroborane pyridine complex, trichloroborane benzylamine complex, irontrichloride triethylamine complex, irontrichloride pyridine complex, and irontrichloride N,N-dimethyloctylamine.

2. The actinic radiation curable composition of claim 1 wherein the stabilizer is selected from the group consisting of borane trimethylamine complex, borane tributylphosphine complex, borane ammoniac complex, bis-(triethylborane) 1,6-diaminohexane complex, trichloroborane triethylamine complex, trichloroborane pyridine complex, trichloroborane benzylamine complex, irontrichloride triethylamine complex, irontrichloride pyridine complex, and irontrichloride N,N-dimethyloctylamine.

3. The actinic radiation curable composition of claim 1 wherein the epoxy resin is a cycloaliphatic diepoxide.

4. The actinic radiation curable composition of claim 3 wherein the cycloaliphatic diepoxide has a monomer purity of 90% or higher.

5. The actinic radiation curable composition of claim 1 wherein two or more epoxy resins are present.

6. The actinic radiation curable composition of claim 5 wherein the two or more epoxy resins are cycloaliphatic diepoxides independently selected from the group consisting of bis(4-hydroxycyclohexyl)methane diglycidyl ether; 2,2-bis(4-hydroxycyclohexyl) propane diglycidyl ether; 3,4-epoxycyclohexylmethyl-3,4-epoxycyclohexanecarboxylate; 3,4-epoxy-6-methyl-cyclohexylmethyl-3,4-epoxy-6-methylcyclohexanecarboxylate; di-(3,4-epoxycyclohexylmethyl) hexanedioate; di-(3,4-epoxy-6-methyl-cyclohexylmethyl) hexanediotate; ethylenebis(3,4-epoxycyclohexanecarboxylate), ethanediol di-(3,4-epoxycyclohexylmethyl) ether and 2-(3,4-epoxycyelohexyl-5,5,3-dioxane).

7. The actinic radiation curable composition of claim 1 wherein the cationic photoiniator is an onium salt with an anion of weak nucleophilicity.

8. The actinic radiation curable composition of claim 7 wherein the onium salt comprises an onium salt of formula (III), (IV) or (V):

$$[R_1\!-\!\!I\!-\!\!R_2]^+ \ A^- \quad (III)$$

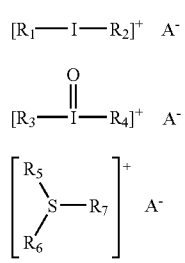

(IV)

(V)

wherein each of $R_1$, $R_2$, $R_3$, $R_4$, $R_5$, $R_6$ and $R_7$ are independently selected from a $C_6$-$C_{18}$ aryl which may be optionally substituted by appropriate radicals; A is $CF_3SO^-_3$ or an anion having the formula $[LQ_m]^-$ where L is selected from the group consisting of boron, phosphorus, arsenic and antimony; Q is a halogen or hydroxyl group; and m is an integer corresponding to the valency of L enlarged by 1.

9. The actinic radiation curable composition of claim 8 wherein the onium salt is a compound having formula (V) and $R_5$, $R_6$ and $R_7$ are independently selected from the group of phenyl and biphenyl.

10. The actinic radiation curable composition of claim 1 wherein the OH-terminated polyether has a molecular weight ranging between 250 to 4000.

11. A method for producing a cured product comprising treating an actinic radiation curable composition according to claim 1 with actinic radiation.

12. A method for producing a stabilized actinic radiation curable composition comprising mixing:
 (A) 40-80 weight % of at least one liquid epoxy resin having an epoxy functionality of 2 or greater;
 (B) 0.1-10 weight % of at least one cationic photoinitiator;
 (C) 5-40 weight % of at least one liquid diacrylate;
 (D) 0-15 weight % of at least one liquid poly(meth)acrylate having a (meth)acrylate functionality of greater than 2;
 (E) 0.1-15 weight % of at least one radical photoiniator;
 (F) 5-40 weight % of at least one OH-terminated polyether, OH-terminated polyester or OH-terminated polyurethane; with
 (G) 0.001-0.3 weight % of at least one stabilizer selected from the group consisting of borane ammoniac complex, borane triethylamine complex, borane tributylphosphine complex, borane trimethylamine complex, borane triphenylphosphine complex, borane tributylamine complex, borane N,N-diethylamine complex, borane N,N-diisopropyl ethylamine complex, borane dimethylamine complex, borane N-ethyl-N-isopropyl aniline complex, borane 4-methyl-morpholine complex, borane 4-ethylmorpholine complex, bis-(triethylborane)1,6-diaminohexane complex, trichloroborane N,N-dimethyloctylamine complex, trichloroborane N,N-dimethyloctylamine complex, trichloroborane triethylamine complex, trichloroborane pyridine complex, trichloroborane benzylamine complex, irontrichloride triethylamine complex, irontrichloride pyridine complex, and irontrichloride N,N-dimethyloctylamine.

* * * * *

UNITED STATES PATENT AND TRADEMARK OFFICE
CERTIFICATE OF CORRECTION

| | | |
|---|---|---|
| PATENT NO. | : 7,595,351 B2 | Page 1 of 1 |
| APPLICATION NO. | : 10/516978 | |
| DATED | : September 29, 2009 | |
| INVENTOR(S) | : Messe et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 774 days.

Signed and Sealed this

Twenty-eighth Day of September, 2010

David J. Kappos
*Director of the United States Patent and Trademark Office*